US008014622B2

(12) United States Patent
Ito et al.

(10) Patent No.: US 8,014,622 B2
(45) Date of Patent: Sep. 6, 2011

(54) IMAGE PROCESSING APPARATUS AND METHOD FOR ATTRIBUTE DATA ENCODING

(75) Inventors: Naoki Ito, Tokyo (JP); Hirokazu Tamura, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 937 days.

(21) Appl. No.: 11/834,215

(22) Filed: Aug. 6, 2007

(65) Prior Publication Data

US 2008/0260273 A1    Oct. 23, 2008

(30) Foreign Application Priority Data

Aug. 8, 2006  (JP) ................................. 2006-216256

(51) Int. Cl.
*G06K 9/36* (2006.01)
(52) U.S. Cl. ...................................................... 382/244
(58) Field of Classification Search .................. 382/232, 382/244, 245
See application file for complete search history.

(56) References Cited

U.S. PATENT DOCUMENTS

| | | | | |
|---|---|---|---|---|
| 5,530,661 | A * | 6/1996 | Garbe et al. ................... | 708/420 |
| 5,883,678 | A * | 3/1999 | Yamaguchi et al. ........ | 348/390.1 |
| 6,061,474 | A * | 5/2000 | Kajiwara et al. .............. | 382/238 |
| 7,106,911 | B2 | 9/2006 | Ohta et al. ..................... | 382/251 |
| 7,194,140 | B2 | 3/2007 | Ito et al. ......................... | 382/251 |
| 7,227,998 | B2 | 6/2007 | Nakayama et al. ........... | 382/232 |
| 7,257,264 | B2 | 8/2007 | Nakayama et al. ........... | 382/239 |
| 2002/0080872 | A1 * | 6/2002 | Takamizawa ................. | 375/240 |
| 2003/0043905 | A1 * | 3/2003 | Nakayama et al. ....... | 375/240.04 |
| 2006/0023957 | A1 | 2/2006 | Ito .................................. | 382/232 |
| 2006/0045362 | A1 | 3/2006 | Ito et al. ........................ | 382/232 |
| 2006/0050975 | A1 | 3/2006 | Ito et al. ........................ | 382/232 |
| 2006/0056713 | A1 | 3/2006 | Ito et al. ........................ | 382/232 |
| 2006/0104528 | A1 | 5/2006 | Tamura et al. ................ | 382/239 |
| 2007/0206867 | A1 | 9/2007 | Tamura et al. ................ | 382/232 |
| 2008/0037882 | A1 | 2/2008 | Tamura et al. ................ | 382/232 |

FOREIGN PATENT DOCUMENTS

| | | |
|---|---|---|
| JP | 2002-084425 A | 3/2002 |
| JP | 2003-069835 | 3/2003 |
| JP | 2005-086353 A | 3/2005 |

OTHER PUBLICATIONS

Japan Patent Office, Office Action, Japanese Patent Application No. 2006-216256, Apr. 18, 2011.

\* cited by examiner

*Primary Examiner* — Bhavesh Mehta
*Assistant Examiner* — Eueng-Nan Yeh
(74) *Attorney, Agent, or Firm* — Fitzpatrick, Cella, Harper & Scinto

(57) ABSTRACT

M×N attribute data for M×N pixels, where M and N are integer multiple of "L" are input. Data expressed by L bits are encoded, A first encoding control step supplies the M×N attribute data to be encoded in an input order, causing encoding to be executed. A second encoding control step converts the M×N attribute data input into bit planes of bit 0 to bit L−1, extracts L-bit data from one converted bit plane, and supplies the extracted L-bit data for each bit plane, causing encoding to be executed. An amount of encoded data generated by the encoding under the control of the first encoding control step is compared with an amount of encoded data generated in the encoding under the control of the second encoding control step, and encoded data with a smaller amount are selected. The selected encoded data and identification information representing the selected data are then output.

6 Claims, 10 Drawing Sheets

FIG. 8

|      | P#1 | P#2 | P#3 | P#4 | P#5 | P#6 | P#7 | P#8 | ... | P#1024 |
|------|-----|-----|-----|-----|-----|-----|-----|-----|-----|--------|
| Bit7 | 0   | 0   | 0   | 0   | 0   | 0   | 0   | 0   |     | 0      |
| Bit6 | 0   | 0   | 0   | 0   | 0   | 0   | 0   | 0   |     | 0      |
| Bit5 | 1   | 1   | 1   | 1   | 1   | 1   | 1   | 1   |     | 1      |
| Bit4 | 0   | 0   | 0   | 0   | 0   | 0   | 1   | 1   |     | 0      |
| Bit3 | 0   | 1   | 1   | 1   | 0   | 1   | 0   | 0   |     | 0      |
| Bit2 | 1   | 0   | 1   | 1   | 1   | 0   | 1   | 1   |     | 1      |
| Bit1 | 1   | 1   | 0   | 0   | 0   | 0   | 0   | 1   |     | 1      |
| Bit0 | 0   | 1   | 1   | 1   | 1   | 0   | 0   | 1   |     | 0      |
|      | 38  | 37  | 37  | 37  | 37  | 38  | 18  | 51  | ... | 38     |

FOUR CONSECUTIVE PIXELS

ENCODE  38   37              38   18   51

CHECK MATCHING BETWEEN PIXEL OF INTEREST AND ADJACENT PIXEL, IF THEY MATCH, ENCODING IS DONE DEPENDING ON NUMERICAL VALUE OF PIXEL OF INTEREST AND THE NUMBER OF CONSECUTIVE PIXELS

{ Bit7 BIT 7 OF P#1
Bit6 BIT 7 OF P#2
Bit5 BIT 7 OF P#3
Bit4 BIT 7 OF P#4
Bit3 BIT 7 OF P#5
Bit2 BIT 7 OF P#6
Bit1 BIT 7 OF P#7
Bit0 BIT 7 OF P#8

BIT 7 OF P#9
BIT 7 OF P#10
BIT 7 OF P#11
BIT 7 OF P#12
BIT 7 OF P#13
BIT 7 OF P#14
BIT 7 OF P#15
BIT 7 OF P#16

BIT 7 OF P#17
BIT 7 OF P#18
⋮
⋮
⋮
BIT 7 OF P#1023
BIT 7 OF P#1024

BIT 6 OF P#1
BIT 6 OF P#2
BIT 6 OF P#3
BIT 6 OF P#4
BIT 6 OF P#5
BIT 6 OF P#6
BIT 6 OF P#7
BIT 6 OF P#8

⋮ }

⇒

|      | P#1 | P#2 | P#3 | P#4 | P#5 | P#6 | P#7 | P#8 | ...... |
|------|-----|-----|-----|-----|-----|-----|-----|-----|--------|
| Bit7 | 0   | 0   | 0   | 0   | 0   | 0   | 0   | 0   |        |
| Bit6 | 0   | 0   | 0   | 0   | 0   | 0   | 0   | 0   |        |
| Bit5 | 1   | 1   | 1   | 1   | 1   | 1   | 0   | 1   |        |
| Bit4 | 0   | 0   | 0   | 0   | 0   | 0   | 1   | 1   |        |
| Bit3 | 0   | 0   | 0   | 0   | 0   | 0   | 0   | 0   |        |
| Bit2 | 1   | 1   | 1   | 1   | 0   | 1   | 0   | 0   |        |
| Bit1 | 1   | 0   | 0   | 0   | 1   | 1   | 1   | 1   |        |
| Bit0 | 0   | 1   | 1   | 1   | 1   | 0   | 0   | 1   |        |
|      | 38  | 37  | 37  | 37  | 37  | 38  | 18  | 51  |        |

FIG. 10

IMAGE PROCESSING APPARATUS AND METHOD FOR ATTRIBUTE DATA ENCODING

BACKGROUND OF THE INVENTION

1. Field of the Invention

The present invention relates to a technique of encoding the attribute data of image data.

2. Description of the Related Art

Image data is sometimes processed using area information (attribute data) associated with the image data. Area information is mainly used for a color process or tone count adjustment in an image output unit to enhance the appearance of an output image. When black is reproduced by mixing yellow, magenta, and cyan in an achromatic color area of a natural image, it can maintain a suitable appearance. When black characters or line images that frequently appear in a document are printed monochromatically using only black, the characters/line images can have sharp edges.

If each pixel has 1-bit attribute data indicating chromatic color/achromatic color or character/non-character, the quality of an output image can be improved at the time of output and, in particular, printing. Information except those described above can also be added as area information.

To compress image information, not only image data but also area information needs to be compressed. Area information is a set of binary data. To compress it, basically, a lossless encoding method must be used. Conventionally, Packbits and JBIG encoding are used to compress area information (e.g., Japanese Patent Laid-Open No. 2003-69835).

However, it is impossible to adjust the code amount of attribute data by compressing it using an encoding method according to the technique in the above reference. Use in a system with a limit memory capacity may cause overflow which poses a serious problem.

SUMMARY OF THE INVENTION

The present invention has been made in consideration of the above-described problem, and has as its object to provide a technique capable of increasing a compression ratio in encoding attribute data expressed by a plurality of bits by using a normal lossless encoding method.

In order to achieve this object, an image processing apparatus of the present invention has the following arrangement. That is, there is provided an image processing apparatus for encoding attribute data of each pixel of image data, which is expressed by L (L>1) bits to indicate ON or OFF state for each of a plurality of attributes, comprising:

an input unit adapted to input M preset attribute data;

an encoding unit adapted to encode data expressed by L bits;

a first encoding control unit adapted to supply the M attribute data input to the input unit to the encoding unit in an input order, thereby causing the encoding unit to execute encoding;

a second encoding control unit adapted to convert the M attribute data input to the input unit into bit planes of bit 0 to bit L−1, extract L-bit data from one converted bit plane, and supply the extracted L-bit data to the encoding unit for each bit plane, thereby causing the encoding unit to execute encoding; and an output control unit adapted to compare an amount of encoded data generated by the encoding unit under the control of the first encoding control unit with an amount of encoded data generated by the encoding unit under the control of the second encoding control unit, select encoded data with a smaller amount, and output the selected encoded data and identification information representing the selected data.

According to the present invention, it is possible to encode attribute data expressed by a plurality of bits at a high compression ratio using a normal lossless encoding technique.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 is a view for explaining the contents of the attribute flag data process in the first phase according to the embodiment;

FIG. 10 is a view for explaining the process contents of an attribute flag decoding unit according to the embodiment.

DESCRIPTION OF THE EMBODIMENTS

An embodiment of the present invention will be described below in detail with reference to the accompanying drawings.

First Embodiment

Figure 2:
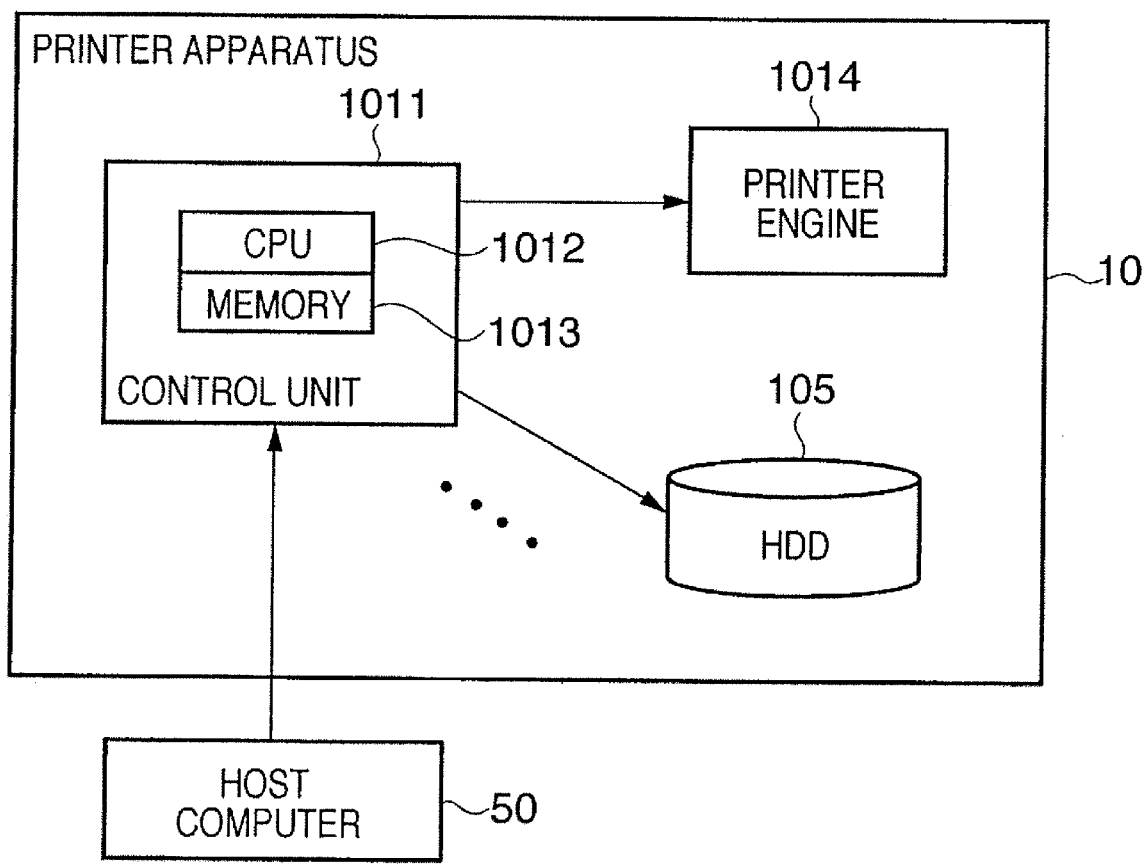
FIG. 2 is a block diagram of a printer apparatus according to the embodiment.

FIG. 2 is a block diagram showing the schematic arrangement of a printing system according to the embodiment. A printer apparatus 10 receives a print job from a host computer 50 and forms a visible image on a printing medium such as a printing paper sheet on the basis of the print job.

A control unit 1011 analyzes the print job received from the host computer 50 and generates image data in a format providable to a printer engine 1014. A CPU 1012 implements various kinds of control in the printer apparatus 10 by executing programs stored in a memory 1013. The printer engine 1014 forms a visible image on a printing paper sheet in accordance with image data received from the control unit 1011. Various kinds of printer engines using, e.g., an electrophotographic scheme, inkjet scheme, or thermal printing scheme are applicable to the printer engine 1014. Reference numeral 105 denotes a hard disk.

An operable printer driver (not shown) corresponding to the printer apparatus 10 is installed in the host computer 50. For example, when an application issues a created document print instruction, the printer driver generates a print job in a page description language (PDL) analyzable by the printer apparatus 10 and transmits it to the printer apparatus 10.

Figure 1:
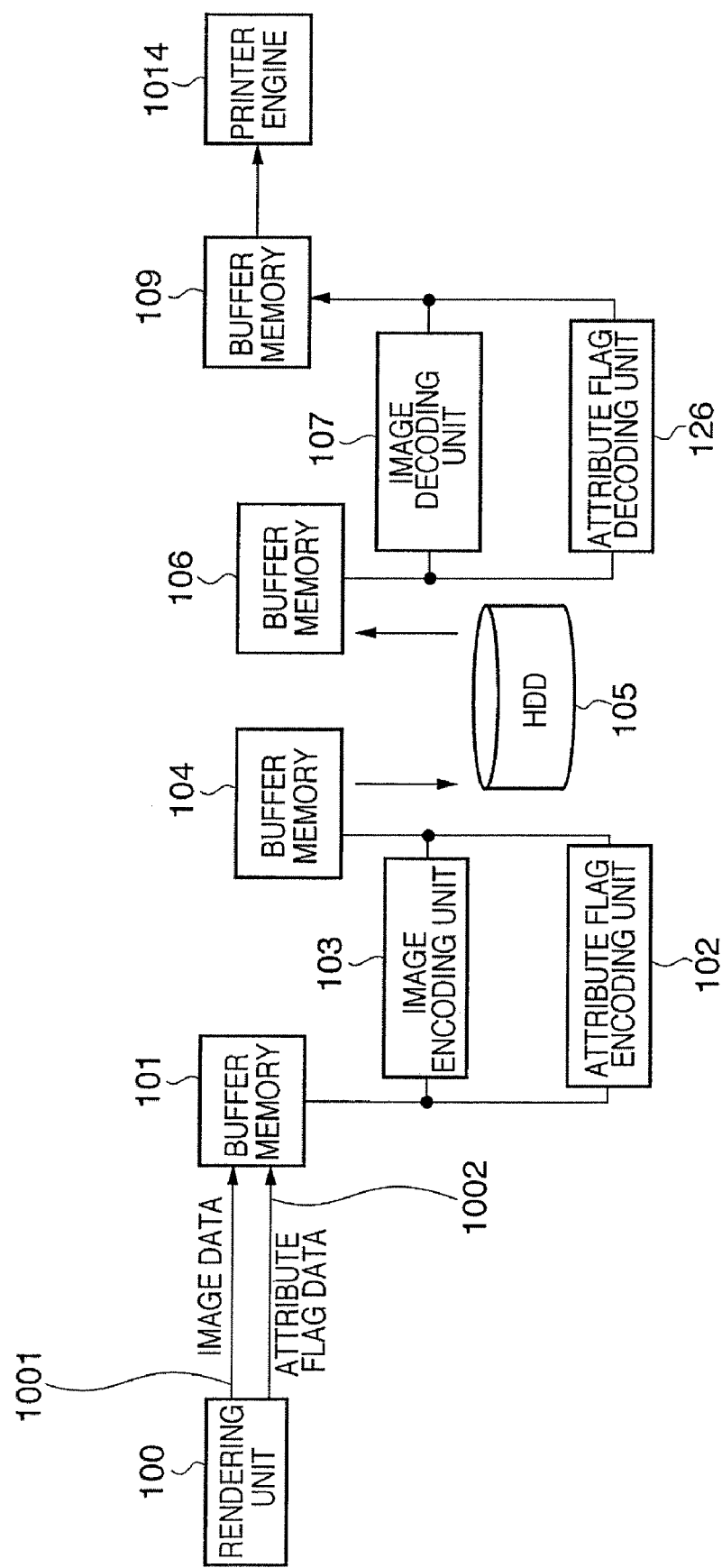
FIG. 1 is a block diagram of an image processing unit according to an embodiment.

FIG. 1 is a block diagram mainly showing the functional blocks of an image processing unit in the printer apparatus 10 according to the embodiment. This image processing unit is implemented using predetermined hardware resources (e.g., line buffers) when the CPU 1012 executes a control program (firmware) stored in the memory 1013.

The image processing unit includes a rendering unit 100, buffer memories 101, 104 106, and 109, attribute flag encoding unit 102, image encoding unit 103, image decoding unit 107, and attribute flag decoding unit 126.

Figure 3:
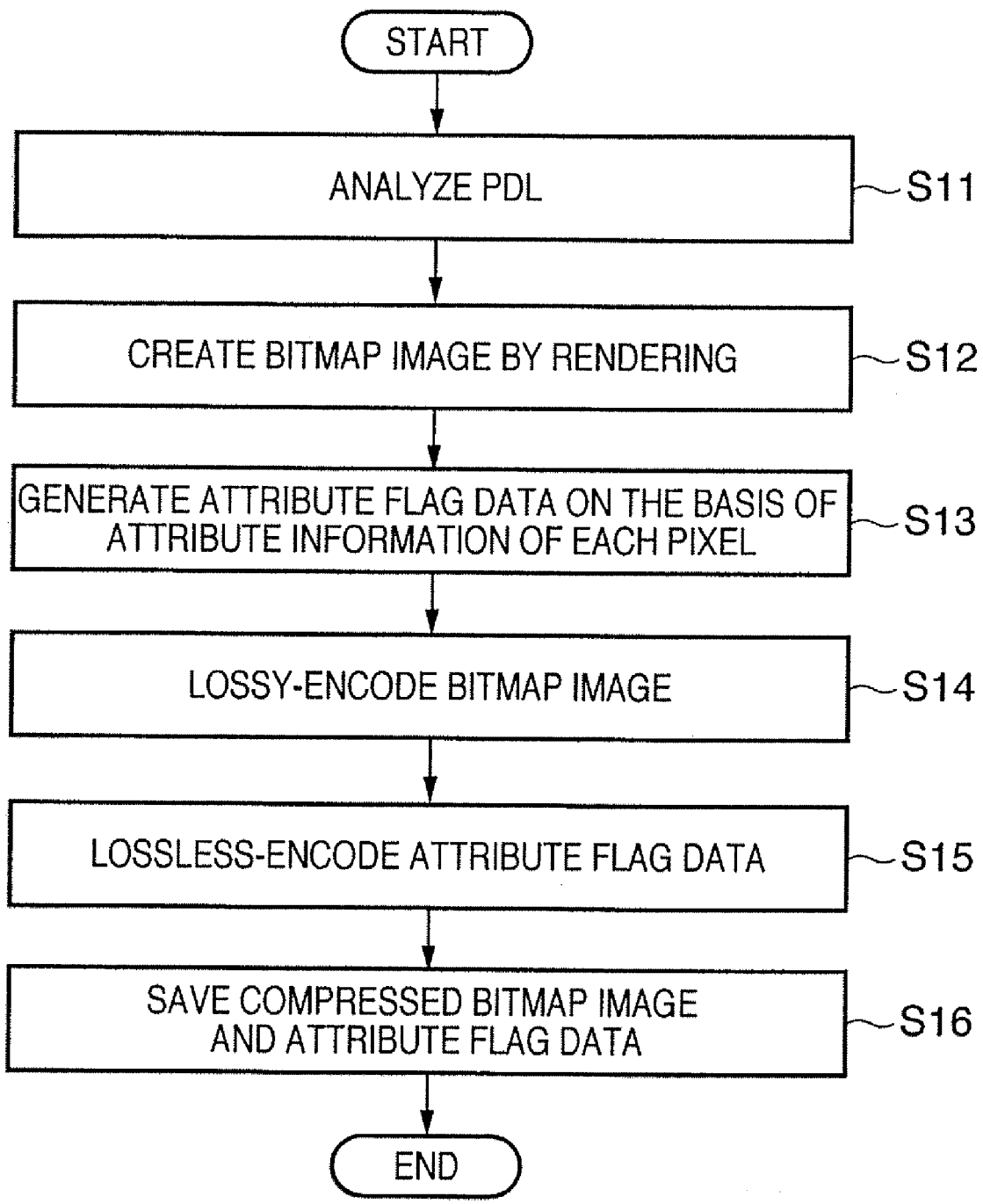
FIG. 3 is a flowchart illustrating a process procedure of encoding an image and attribute flag data according to the embodiment.

The operation of the printer apparatus 10 according to the embodiment with the above-described arrangement will be described with reference to the flowchart in FIG. 3.

Upon receiving a print job from the host computer 50, the rendering unit 100 analyzes the PDL. PDL data includes a line image rendering command, a character rendering command containing a typeface (font name), size, and character code, and bitmap data such as a natural image. The rendering unit 100 analyzes the commands and executes rendering in a rendering area ensured in the memory 1013. The rendering process reveals the attributes of individual pixels. The attributes are written in an attribute flag area allocated in the memory 1013 as attribute flags (in this embodiment, attribute data is expressed by 1 byte whose bits are assigned eight ON/OFF identification data including chromatic color/achromatic color, character/non-character (natural image), halftone dot/non-halftone dot, line image/non-line image, presence/absence of objects, scanner input/PDL input, and graphic/non-graphic) (steps S11, S12, and S13).

The rendering unit 100 stores the rendered bitmap image in the buffer memory 101 via a signal line 1001 and the attribute flag data in the buffer memory 101 via a signal line 1002. The image encoding unit 103 compression-codes the rendered bitmap image data by a lossy compression coding method (JPEG method in this embodiment) (step S14). On the other hand, the attribute flag encoding unit 102 lossless-compression-codes the attribute flag data (step S15). The encoded image data and attribute flag data are temporarily stored in the buffer memory 104, associated with each other, and stored in the HDD 105 as files.

In the above-described way, image data and attribute flag data are encoded for each page and stored in the HDD 105.

The image decoding unit 107 and attribute flag decoding unit 126 monitor the presence/absence of encoded image data files and encoded attribute flag data files in the HDD 105. Upon determining that an unprinted data file exists, the decoding units read out the compressed data files from the HDD 105 and decode them in accordance with the print speed of the printer engine 1014. Image data obtained by decoding is subjected to various kinds of image processing corresponding to the decoded attribute flag data and output to the printer engine 1014.

That is, image data and attribute flag data are encoded independently (asynchronously) of the print speed of the printer engine 1014. This quickly releases the host computer from the print data output process.

The embodiment has its characteristic feature in compression coding of an image and attribute flag data. The compression process will be described below in more detail.

Image data and attribute flag data generated by the rendering unit 100 are stored in the buffer memory 101. The image encoding unit 103 receives each tile of M×N pixels from the buffer memory 101 and encodes the received tile of color image data by discrete cosine transformation encoding (JPEG). The attribute flag encoding unit 102 also run-length-encodes attribute flag data corresponding to M×N pixels. M and N need to be multiples of a window size for discrete cosine transformation encoding. In this embodiment, image data is encoded by employing a JPEG compression method, the minimum encoding window size is 8×8 pixels. The size of one tile is set to an integer multiple of the window size, e.g., M=N=32 (8×4). A tile with 32×32 pixels contains 4×4 (16) pixel windows each having 8×8 pixels. Hence, to encode one tile, JPEG compression of an 8×8 pixel window is executed 16 times. The following explanation will be done assuming M=N=32. However, the value is not limited to this.

The image encoding unit 103 quantizes 16 8×8 pixel windows contained in a tile image with 32×32 pixels by known DCT. The image encoding unit 103 then assigns Huffman code words to the quantized data to generate code words.

The attribute flag encoding unit 102 also run-length-encodes each tile containing 32×32 pixels and outputs code words.

The encoded data thus output from the image encoding unit 103 is stored in the buffer memory 104. The attribute flag encoding unit 102 outputs the encoded data of the attribute flag data to the buffer memory 104. When the buffer memory 104 stores the encoded data of image data and attribute flag data corresponding to one tile, they are stored as additional data in the corresponding files ensured in the HDD 105.

As described above, the rendered bitmap image is JPEG-compressed and saved. It is therefore easy to handle the data.

The arrangements and operations of the image encoding unit 103 and image decoding unit 107 will be described in detail with reference to FIG. 4. The arrangement and operation of the attribute flag encoding unit 102 will be described in detail with reference to FIG. 5.

Figure 4:
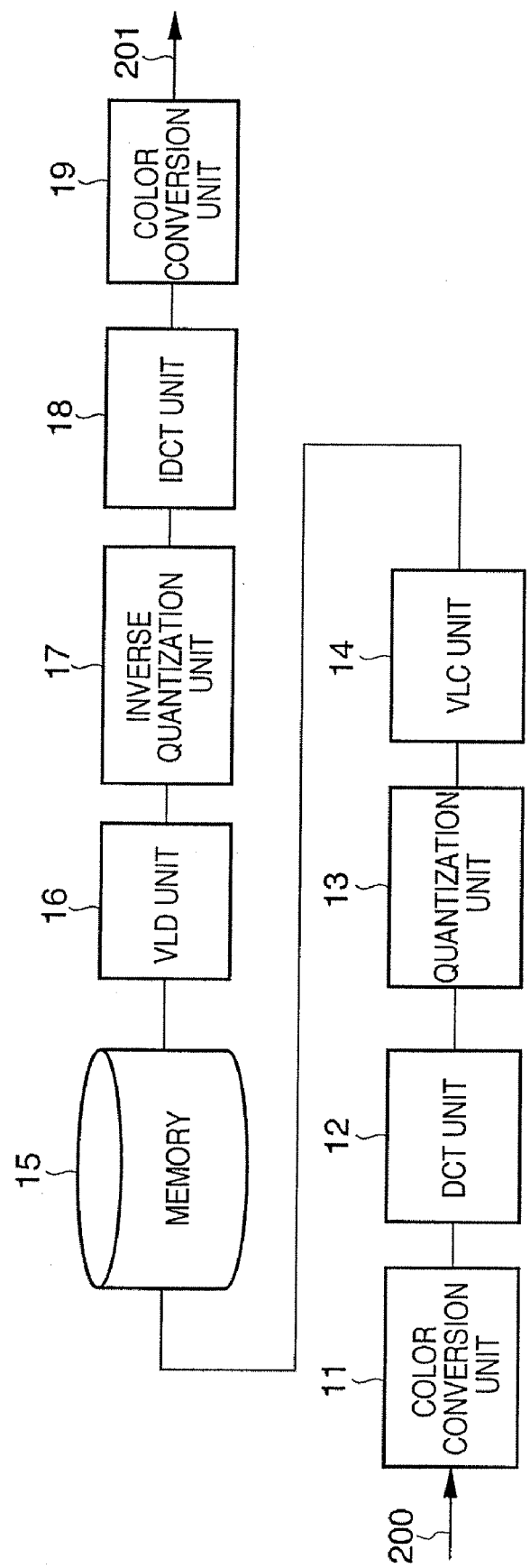
FIG. 4 is a view showing the sequence of an image encoding unit and image decoding unit according to the embodiment.

FIG. 4 is a view showing the flow of data in the image encoding unit 103 and image decoding unit 107. In FIG. 4, units 11 to 14 correspond to the arrangement of the image encoding unit 103, and units 16 to 19 correspond to the arrangement of the image decoding unit 107. A memory 15 includes the buffer memories 104 and 106 and the HDD 105.

A bitmap image 200 rendered by the rendering unit 100 is supplied to the color conversion unit 11 of the image encoding unit 103 via the buffer memory 101. The bitmap image is supplied as an image signal. A color signal has, e.g., three color components of red (R), green (G), and blue (B) each expressed by 256 tones (8 bits).

The color conversion unit 11 converts the received R, G, and B signals into luminance and color difference signals (Y, Cb, and Cr). The DCT unit (discrete cosine transformation) 12 executes spatial frequency transformation (DCT) for each 8×8 pixel block of each of the luminance Y and color difference signals Cb and Cr. The quantization unit 13 quantizes the DCT coefficients to reduce the data amount. The VLC unit (variable-length coding unit) 14 Huffman-encodes the quantization values to further reduce the data amount.

The functional arrangement of the image encoding unit 103 has been described above. The compressed image data is stored in the buffer memory 104 and HDD 105 in this order (memory 15 in FIG. 4).

The stored compressed image data is decoded in accordance with the following procedure. First, the VLD unit (variable-length decoding unit) 16 Huffman-decodes the compressed image data. The inverse quantization unit 17 returns the data to DCT coefficient values by using a set inverse quantization matrix. The IDCT unit (inverse discrete cosine transformation unit) 18 executes inverse discrete cosine transformation to return the DCT coefficients to the luminance and color difference signals. The color conversion unit 19 converts the luminance Y and color difference signals Cb and Cr into print color components of Y (yellow), M (magenta), C (cyan), and K (black). As a result of the above-described compression and decoding processes, the image decoding unit 107 outputs a color image signal 201.

Figure 5:
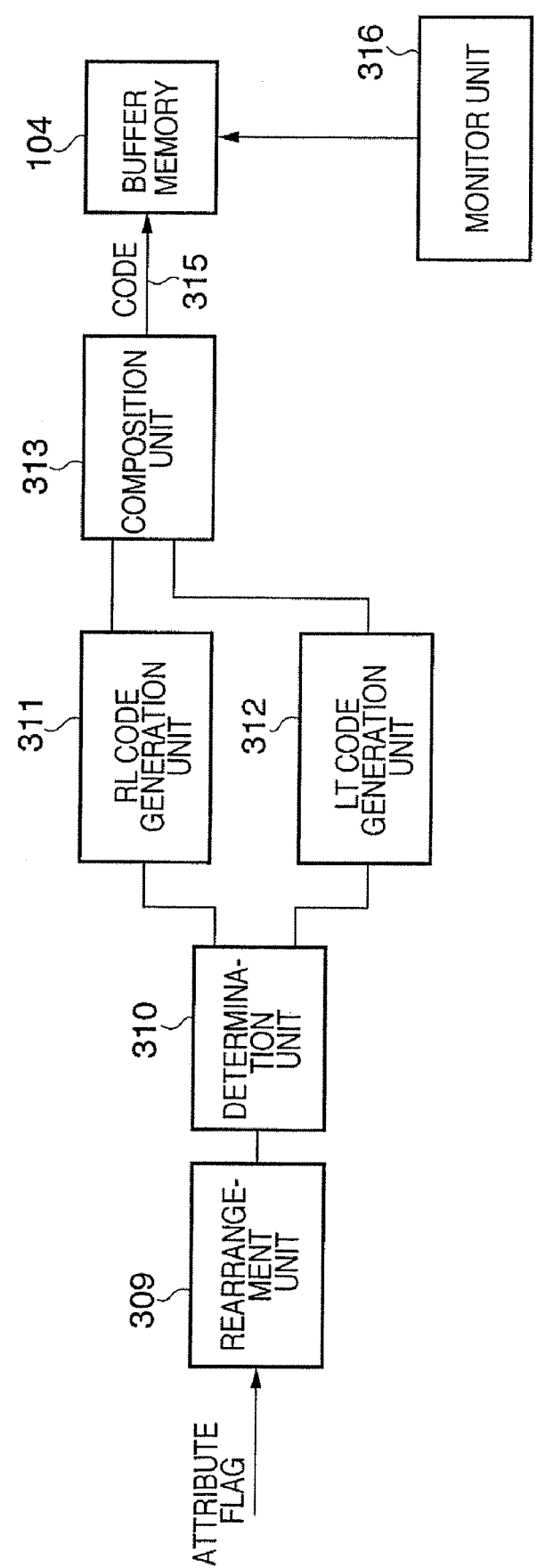
FIG. 5 is a block diagram of an attribute flag encoding unit according to the embodiment.

FIG. 5 is a block diagram of the attribute flag encoding unit 102.

The attribute flag encoding unit 102 of this embodiment lossless-encodes attribute flag data (one attribute flag data=1 byte=8 bits) of one tile (32×32 pixels) twice. One of the two encoded data obtained by the two encoding processes, which has a smaller data amount, is output as the final encoded data of attribute flag data.

A rearrangement unit 309 performs different operations in the first and second phases (to be described later in detail). As a common operation in the two phases, the rearrangement unit 309 reads out 32×32 flag data from the buffer memory 101 in the raster scan order and outputs them as 1-byte (8 bits) blocks.

A determination unit 310 determines whether the attribute flag data of a received current pixel and that of a preceding pixel have the same value. If the attribute flag data have the same value, that of the current pixel is sent to an RL code generation unit 311. If the attribute flag data have different values, the data is sent to an LT code generation unit 312. The RL code generation unit 311 counts the number of times when the attribute flag data of the current pixel and that of the preceding pixel have the same value. If the current pixel and preceding pixel have different attribute flag data, or if the current pixel is located at the end of a line in a 32×32 pixel block, the RL code generation unit 311 outputs the code word of the count value. The LT code generation unit 312 counts the number of times when the attribute flag data of the current pixel and that of the preceding pixel have different values and outputs a code word corresponding to the count value and attribute flag data equal in number to the count. A composition unit 313 composites data output from the RL code generation unit 311 and data output from the LT code generation unit 312 and outputs the composited data as a code 315. That is, the attribute flag encoding unit 102 of this embodiment uses a Packbits encoding technique.

The arrangement and operation of the image decoding unit 107 are designed to reconstruct data by an operation reverse to the attribute flag encoding unit 102.

Attribute flag data is encoded using the above-described lossless encoding method. An implementation method to increase the encoding efficiency will be described below.

In this embodiment, the attribute flag data of one pixel has a size of 1 byte (8 bits). The bits are assigned flags shown in FIG. 7. Bits 0 to 7 are assigned information representing the presence/absence of pertinent attributes of a pixel. Bits 7 and 6 are undefined and have a fixed value of "0".

Figure 6:
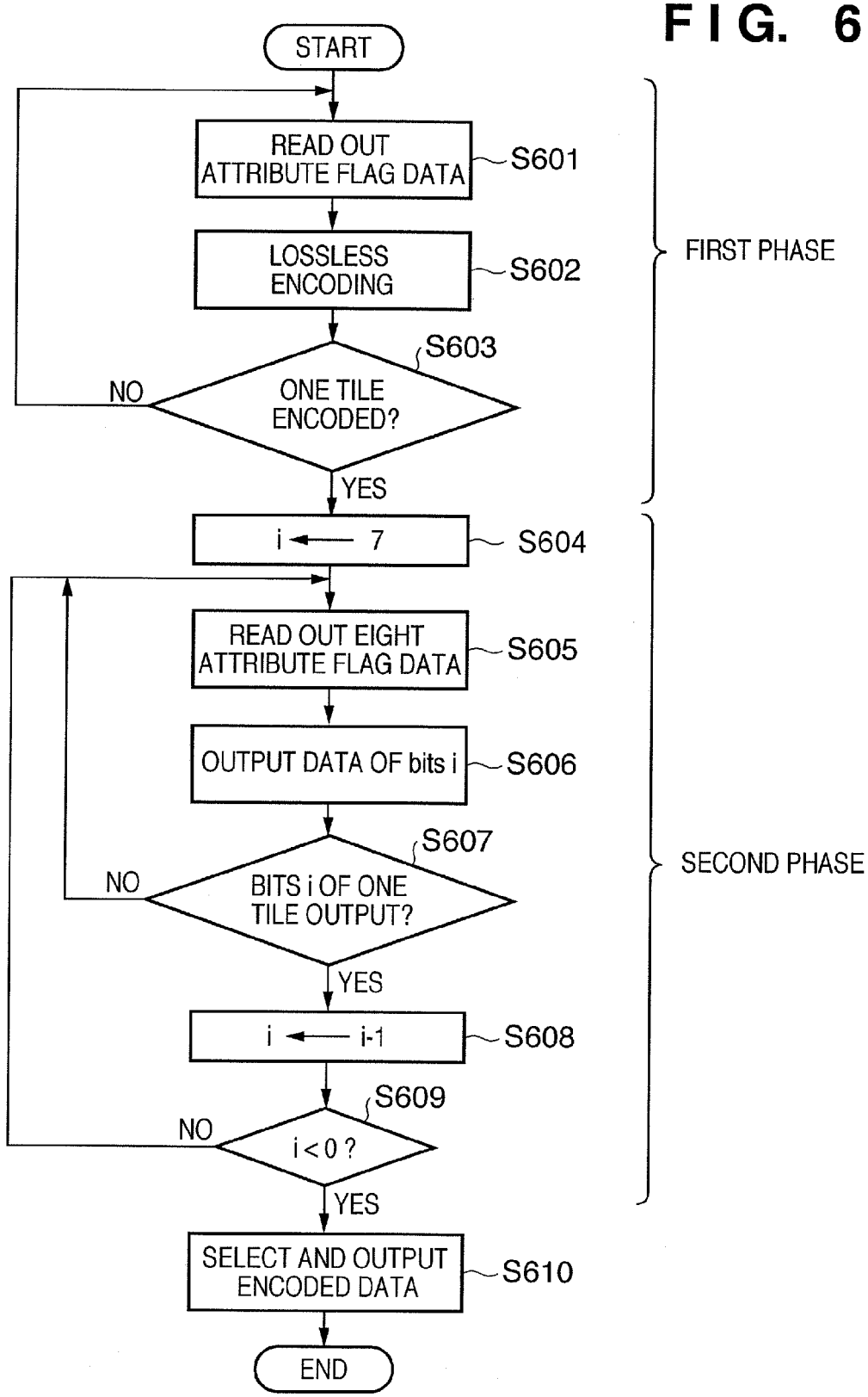
FIG. 6 is a flowchart illustrating the encoding procedure of the attribute flag encoding unit according to the embodiment.

The process procedure of the attribute flag encoding unit 102 according to the embodiment will be described with reference to the flowchart in FIG. 6.

The first phase will be described. In this phase, the rearrangement unit 309 reads out each (e.g., 8-bit attribute flag data representing one pixel) of the attribute flag data of 32×32 pixels from the buffer memory 101 and directly output the data to the determination unit 310 (step S601). In step S602, lossless encoding is executed. The encoding result is stored in the buffer memory 104. This process is repeated until it is determined in step S603 that the attribute flag data of one tile is encoded (32×32=1024 times). The encoding process in step S602 is the same as that explained with reference to FIG. 5. FIG. 8 shows an example.

Referring to FIG. 8, attribute flag data of 32×32 pixels are numbered in the scan order and called pixel #1, pixel #2, ..., pixel #1024. Note, "P #n" (n=1, 2, ...) in FIG. 8 denotes pixel #n.

The attribute flag data value of pixel #1 is 38 (26 in hexadecimal notation), and that of pixel #2 is 37. Four pixels #2 to #5 continuously have the same value four times. The compression ratio is high in this section. The process of the first phase has been described above.

The second phase from step S604 will be explained next. The attribute data encoding order in the second phase is different from that in the first phase.

In step S604, an initial value "7" is set in a variable i. Eight attribute flag data are read out from the buffer memory 104 (step S605). In step S606, bits i (bits 7 in the initial value) of the eight attribute flag data are bundled up to generate 8-bit (1-byte) data. The data is output to the determination unit 310, which encodes the data. This process is executed by the rearrangement unit 309.

In step S607, it is determined whether the data of bits i of all attribute flag data of one tile are output. If NO in step S607, the process returns to step S605 to read out the next eight attribute flag data. This process is repeated until it is determined that the data of bits i of attribute flag data in one tile are output. That is, a bit plane data represented by the variable i is generated from 32×32 attribute data. Every 8-bit data is extracted from the bit plane data and encoded.

When output (encoding) of bits i is ended, the process advances to step S608 to decrement the variable i by "1". In step S609, it is determined whether the variable i has a negative value. If i≧0, output/encoding of all bits of all attribute flag data in one tile has not finished yet, the process returns to step S605 to repeat the above-described process.

Figure 9:
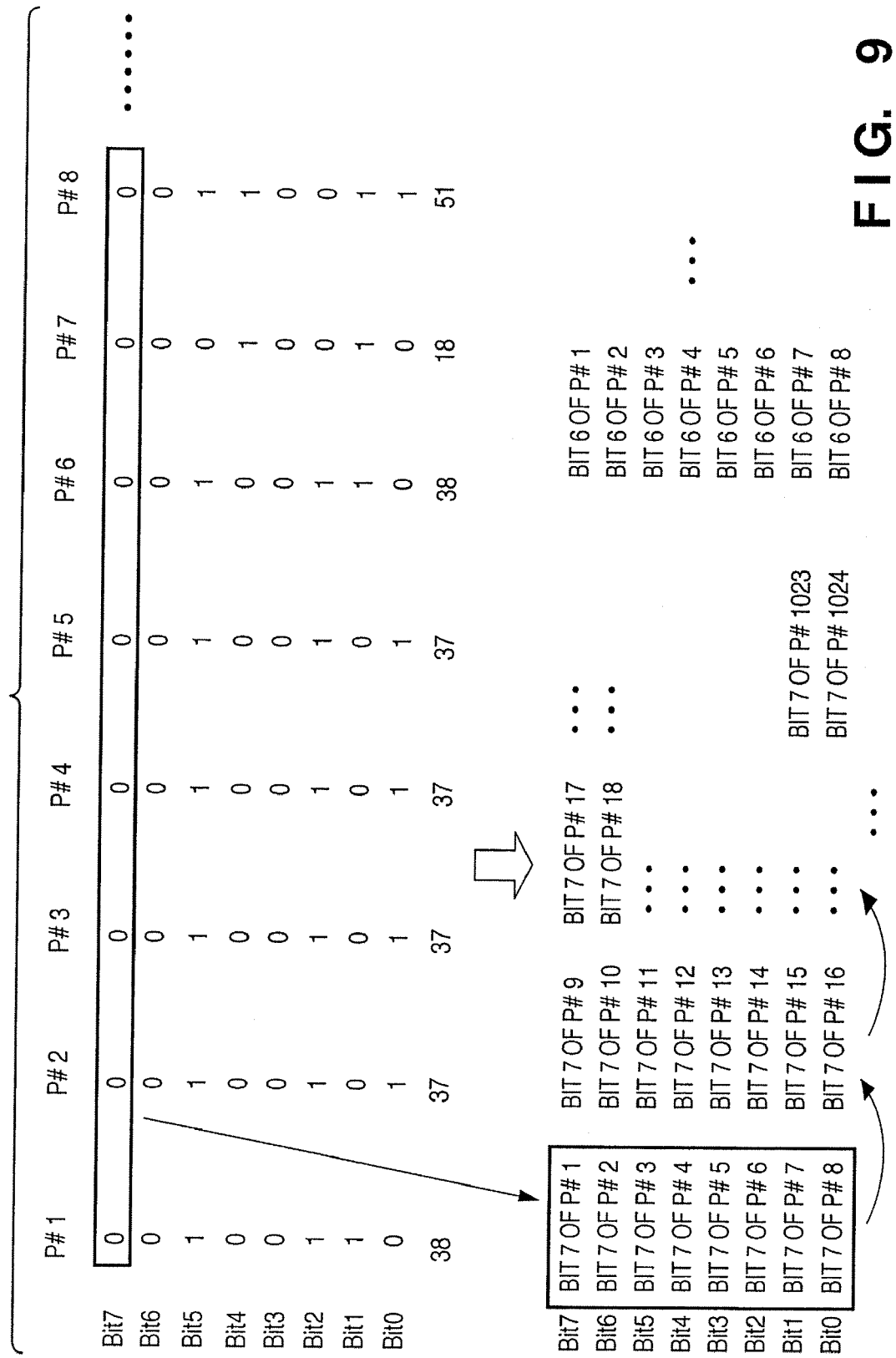
FIG. 9 is a view for explaining the contents of the attribute flag data process in the second phase according to the embodiment.

FIG. 9 shows attribute flag data input to the rearrangement unit 309 in the second phase and rearranged data.

First, 1-byte data including bits 7 of the attribute flag data of pixels #1 to #8 is output. Next, 1-byte data including bits 7 of pixels #9 to #16 is output. Finally, 1-byte data including bits 7 of pixels #1016 to #1024 is output. Then, the same process is done for the data of bits 6, and ultimately, 1-byte data including bits 0 of pixels #1016 to #1024 is output. The process in the second phase has been described above.

When the process in the first and second phases finishes, the buffer memory 104 stores lossless-encoded data generated in the first and second phases. In step S610, data with a smaller amount is output to the HDD 105 as the final encoding result of attribute flag data. At this time, the header at the start of the selected encoded data of attribute flag data stores identification information indicating the selected phase, the first phase or second phase, i.e., information representing whether rearrangement has been done. In this embodiment, the identification information can have a size of 1 bit because it need only clarify one of the two phases. If the two encoded data are the same, the encoded data obtained in the first phase is selected. This is because the process of restoring the initial state in decoding is unnecessary, and the process speed can increase.

The image encoding unit 103 of this embodiment uses JPEG encoding. Since many multiplication processes for DCT and many division processes for quantization are necessary, encoding of one tile requires a long time. On the other hand, the attribute flag encoding unit 102 of this embodiment executes the encoding process twice most of which are simple processes of, e.g., comparing the current pixel and the preceding pixel and counting the number of times when they have the same value. Hence, the time until the attribute flag encoding unit 102 determines the final encoded data can be much shorter than the time necessary for the image encoding unit 103 although the processes of two phases are executed. Even when the attribute flag encoding unit 102 executes encoding in two phases, the image data encoding process never slows down. Even if the speed decreases, the delay is negligible.

In the decoding process of the attribute flag decoding unit 126, first, lossless-encoded (in this embodiment, run-length-encoded) data of one tile is received and run-length-decoded. If the header stores information representing that the lossless-encoded data is generated in the first phase, i.e., without rearrangement, the data is directly output. If the header stores information indicating the second phase (information indicating rearrangement), the first 1-byte data includes the data of bits 7 of the attribute flag data of pixels #1 to #8, and the second 1-byte data includes the data of bits 7 of the attribute flag data of pixels #9 to #16, as shown in FIG. 10. Hence, the bit data are rearranged. After this process, the attribute flag data are output in the initial order of pixel #1, pixel #2, . . . .

As described above, according to the embodiment, since encoding is executed in the attribute data encoding order in the second phase, it is possible to encode data using the fact that the probability that the attribute flag data of adjacent pixels have the same bit position is higher than the probability that the attribute flag data of adjacent pixels have the same value. As a result, the compression ratio can be higher than in simple encoding.

According to the embodiment, two kinds of encoded data are generated for each attribute flag data. Encoded data with a smaller amount is selected and output. This implements encoding at a high compression ratio. The encoding algorithm does not change. To implement the process by hardware, it is only necessary to add the rearrangement unit 309. Hence, the problem of the increase in cost caused by the addition of the circuit will not be so serious.

In the embodiment, if bit data are rearranged, attribute flag data are output in an order from the plane of bit 7 to a lower bit. However, the order may be reverse.

Figure 7:
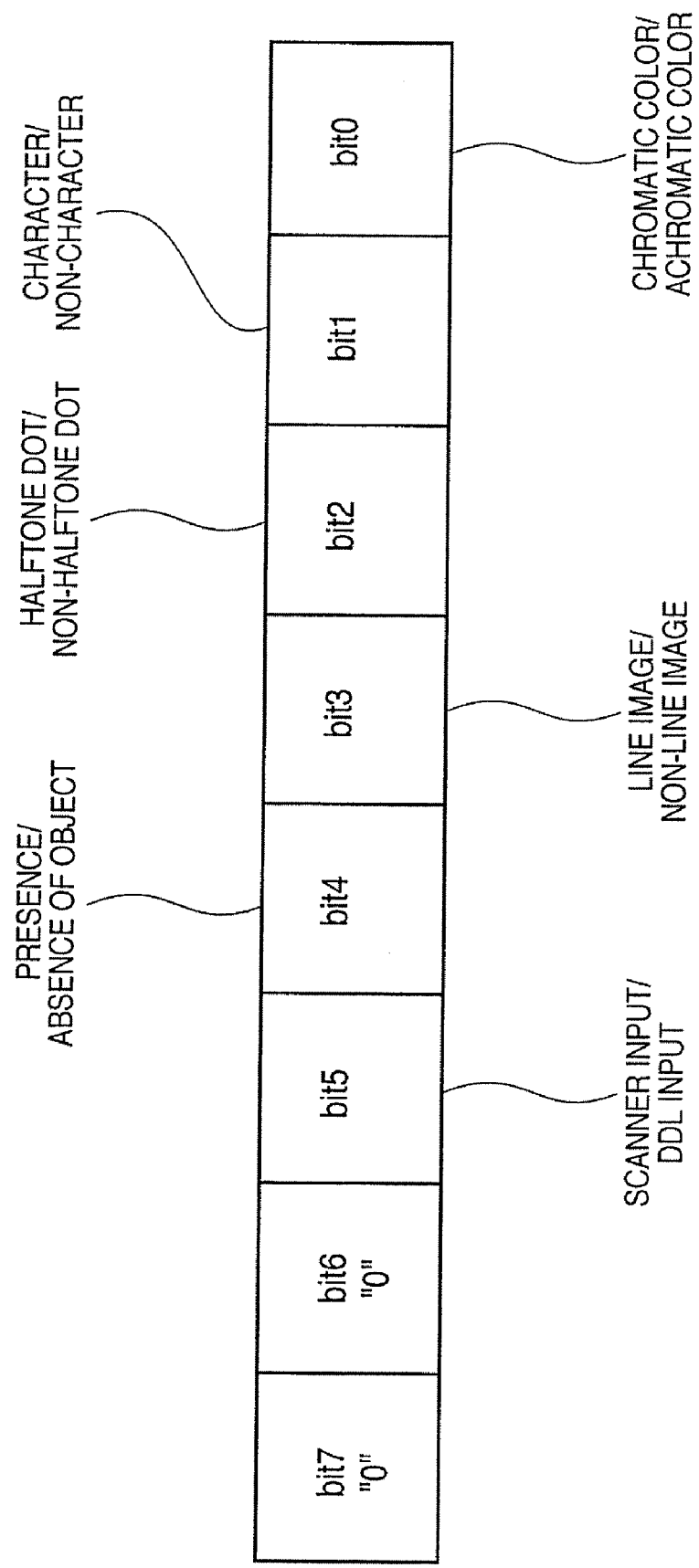
FIG. 7 is a view showing the data format of an attribute flag according to the embodiment.

In the embodiment, attribute flag data encoding is executed twice. Data input to the lossless encoding unit is assumed to have a size of 8 bits. However, if the significant bits of attribute flag data are less than 8 bits, and the remaining bits are handled as reserved bits (dummy data are added), rearranged encoded data may be employed from the beginning. Especially when bits 7 and 6 of attribute flag data are handled as reserved bits, as shown in FIG. 7, bit planes of the reserved bits have the same value. This enables to earn runs and guarantees a high compression ratio from the start. Hence, if attribute flag data has the structure shown in FIG. 7, lower bits from bit 5 are encoded. In this case, "5" is substituted into the variable i in step S604 in FIG. 6. In decoding, lower bits from bit 5 are decoded, and "0" is stored in bits 6 and 7 of data to be output.

In the embodiment, the attribute flag encoding unit 102 and image encoding unit 103 encode tiles having the same size as a unit. However, the tile size of the encoding unit of the attribute flag encoding unit 102 may be different from that of the image encoding unit 103.

The encoding unit of the attribute flag encoding unit 102 may be not a tile but attribute flag data corresponding to one line containing pixels equal in number to the horizontal pixels of an encoding target image. In this case, each line is encoded in the first and second phases, and data with a smaller code amount is selected. Identification data is added to the start, and the selected encoded data is output.

As described above, the control unit 1011 shown in FIG. 2 which has the CPU and the memory storing programs implements the arrangement shown in FIG. 1. Hence, the present invention can also be implemented by a computer program.

The computer program is normally stored in a computer-readable storage medium such as a CD-ROM. The computer program becomes executable when it is set in a read device of a computer and copied or installed in the system. Such a computer-readable storage medium is also incorporated in the present invention, as a matter of course.

The above-described attribute flag data encoding is preferably lossless encoding. However, the present invention is not limited to this. Its object is almost achieved if encoding is done by a method capable of minimizing the difference from original data.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-216256, filed Aug. 8, 2006, which is hereby incorporated by reference herein in its entirety.

What is claimed is:

1. An image processing apparatus for encoding attribute data of each pixel of image data, which is expressed by L (L>1) bits to indicate ON or OFF state for each of a plurality of attributes, comprising:
   at least one processor configured to function as:
   an input unit adapted to input M×N attribute data for M×N pixels, where M and N are integer multiple of "L";
   an encoding unit adapted to encode data expressed by L bits;
   a first encoding control unit adapted to supply the M×N attribute data input by said input unit to said encoding unit in an input order, thereby causing said encoding unit to execute encoding;
   a second encoding control unit adapted to convert the M×N attribute data input by said input unit into bit planes of bit 0 to bit L−1, extract L-bit data from one converted bit plane, and supply the extracted L-bit data to said encoding unit for each bit plane, thereby causing said encoding unit to execute encoding; and
   an output control unit adapted to compare an amount of encoded data generated by said encoding unit under the control of said first encoding control unit with an amount of encoded data generated by said encoding unit under the control of said second encoding control unit, select encoded data with a smaller amount, and output the selected encoded data and identification information representing the selected data.

2. The apparatus according to claim 1, wherein said encoding unit executes run-length encoding.

3. The apparatus according to claim 1, wherein said encoding unit executes Packbits encoding.

4. The apparatus according to claim 1, further comprising an image encoding unit adapted to lossy-encode, as a unit, an image containing M×N pixels from multi-valued image data as a base of the attribute data.

5. A control method of an image processing apparatus for encoding attribute data of each pixel of image data, which is expressed by L (L>1) bits to indicate ON or OFF state for each of a plurality of attributes, comprising:
   the input step of inputting M×N attribute data for M×N pixels, where M and N are integer multiple of "L";
   the encoding step of encoding data expressed by L bits;

the first encoding control step of supplying the M×N attribute data input in the input step by the encoding step in an input order, thereby causing the encoding step to execute encoding;

the second encoding control step of converting the M×N attribute data input in the input step into bit planes of bit 0 to bit L−1, extracting L-bit data from one converted bit plane, and supplying the extracted L-bit data to the encoding step for each bit plane, thereby causing the encoding step to execute encoding; and the output control step of comparing an amount of encoded data generated in the encoding step under the control of the first encoding control step with an amount of encoded data generated in the encoding step under the control of the second encoding control step, selecting encoded data with a smaller amount, and outputting the selected encoded data and identification information representing the selected data.

6. A non-transitory computer-readable storage medium which is stored in a computer-readable storage medium and read out and executed by a computer to execute a method of claim 5.

* * * * *